(12) United States Patent
Tschinderle et al.

(10) Patent No.: US 9,633,890 B2
(45) Date of Patent: Apr. 25, 2017

(54) DEVICE FOR TREATING SURFACES OF WAFER-SHAPED ARTICLES AND GRIPPING PIN FOR USE IN THE DEVICE

(75) Inventors: Ulrich Tschinderle, Feistriz/Gail (AT); Andreas Gleissner, Radenthein (AT); Thomas Wirnsberger, Seeboden (AT); Franz Kumnig, Lieserbrucke (AT); Rainer Obweger, Lind im Drautel (AT)

(73) Assignee: Lam Research AG, Villach (AT)

( * ) Notice: Subject to any disclaimer, the term of this patent is extended or adjusted under 35 U.S.C. 154(b) by 1262 days.

(21) Appl. No.: 13/328,212

(22) Filed: Dec. 16, 2011

(65) Prior Publication Data

US 2013/0154203 A1    Jun. 20, 2013

(51) Int. Cl.
| | | |
|---|---|---|
| *B23B 31/18* | (2006.01) | |
| *H01L 21/687* | (2006.01) | |
| *H01L 21/67* | (2006.01) | |

(52) U.S. Cl.
CPC .. *H01L 21/68728* (2013.01); *H01L 21/67051* (2013.01); *H01L 21/68785* (2013.01); *Y10T 279/17213* (2015.01)

(58) Field of Classification Search
CPC   B08B 3/04; B08B 11/02; H01L 21/34; H01L 21/68; H01L 21/67051; H01L 21/68728; H01L 21/68785; H01L 21/6708; Y10S 134/902
USPC .......... 269/903, 296, 21; 134/153, 140, 148, 134/149, 157, 158, 151, 902, 147
See application file for complete search history.

(56) References Cited

U.S. PATENT DOCUMENTS

| | | | |
|---|---|---|---|
| 1,803,136 A * | 4/1931 | Schulze | F16D 1/092 403/253 |
| 4,903,717 A | 2/1990 | Sumnitsch | |
| 5,185,956 A | 2/1993 | Steere, Jr. | |
| 5,513,668 A | 5/1996 | Sumnitsch | |
| 6,374,836 B1 * | 4/2002 | Oroku | B08B 3/04 134/140 |
| 6,452,195 B1 | 9/2002 | Smick et al. | |
| 6,485,531 B1 | 11/2002 | Schob | |
| 6,515,387 B1 * | 2/2003 | Shinozaki | F16C 32/0451 310/90.5 |
| 8,608,146 B2 * | 12/2013 | Brugger | H01L 21/68757 269/21 |

(Continued)

FOREIGN PATENT DOCUMENTS

WO    2007/101764 A1    9/2007

OTHER PUBLICATIONS

Helbert, J.N.. (2001). Handbook of VLSI Microlithography—Principles, Technology and Applications (2nd Edition)—5.10.3.6 Chucks. William Andrew Publishing/Noyes.*

(Continued)

*Primary Examiner* — Larry E Waggle, Jr.
*Assistant Examiner* — Mahdi H Nejad

(57) ABSTRACT

A device for processing wafer-shaped articles comprises a rotary chuck having a series of pins adapted to hold a wafer shaped article on the rotary chuck. Each of the pins comprises a cylindrical body and a projecting gripping portion formed integrally therewith. The cylindrical body and gripping portion are made from a ceramic material. The gripping portion comprises cylindrical surfaces having a common generatrix with surfaces of the cylindrical body.

18 Claims, 4 Drawing Sheets

(56) References Cited

U.S. PATENT DOCUMENTS

| | | | | |
|---|---|---|---|---|
| 9,190,310 B2* | 11/2015 | Brugger | | H01L 21/6838 |
| 9,421,617 B2* | 8/2016 | Goodman | | B23B 31/14 |
| 2001/0010103 A1* | 8/2001 | Konishi | | B08B 1/04 |
| | | | | 15/77 |
| 2002/0105277 A1 | 8/2002 | Tomita et al. | | |
| 2007/0199656 A1* | 8/2007 | Leavitt | | H01J 37/20 |
| | | | | 156/345.11 |
| 2007/0238321 A1* | 10/2007 | Futase | | H01L 21/02057 |
| | | | | 438/502 |
| 2007/0256785 A1 | 11/2007 | Pamarthy et al. | | |
| 2008/0061519 A1* | 3/2008 | Cho | | B23B 31/1269 |
| | | | | 279/106 |
| 2011/0253181 A1* | 10/2011 | Obweger | | H01L 21/68707 |
| | | | | 134/157 |
| 2011/0254236 A1* | 10/2011 | Brugger | | H01L 21/6838 |
| | | | | 279/125 |
| 2012/0018940 A1* | 1/2012 | Kumnig | | H01L 21/68728 |
| | | | | 269/225 |
| 2012/0263569 A1* | 10/2012 | Priddy | | C30B 23/02 |
| | | | | 414/800 |
| 2012/0325275 A1* | 12/2012 | Goodman | | B23B 31/14 |
| | | | | 134/149 |
| 2013/0062839 A1* | 3/2013 | Tschinderle et al. | | 279/157 |
| 2013/0127102 A1* | 5/2013 | Kinoshita | | H01L 21/6838 |
| | | | | 269/20 |
| 2015/0270146 A1* | 9/2015 | Yoshihara | | H01L 21/67028 |
| | | | | 134/18 |
| 2015/0338328 A1* | 11/2015 | Hombo | | H01L 21/67253 |
| | | | | 73/7 |

OTHER PUBLICATIONS

Techniques and Tools for Optical Lithography; Copyright 2001; Whit Walso, Motorola, Inc.; p. 561 (Chucks).*

International Search Report, dated May 6, 2013, from corresponding PCT application.

* cited by examiner

DEVICE FOR TREATING SURFACES OF WAFER-SHAPED ARTICLES AND GRIPPING PIN FOR USE IN THE DEVICE

BACKGROUND OF THE INVENTION

1. Field of the Invention

The invention relates generally to devices for treating surfaces of wafer-shaped articles, such as semiconductor wafers. The invention also relates to gripping pins that secure a wafer-shaped article within such devices.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

Certain of the processes to which semiconductor wafers are subjected involve very aggressive chemicals applied at elevated temperatures, in which case the components of the chuck must be able to withstand those extreme process conditions. For example, certain processes utilize highly concentrated sulfuric acid at temperatures that can reach 250° C. or more, which results in a temperature increase of the wafer as well.

However, the chuck pins conventionally used to hold the wafer on the chuck, which are typically made of a chemically inert plastic such as polyetheretherketone (PEEK), cannot withstand these extreme high temperatures. If on the other hand the pins are made of a refractory material such as ceramic or quartz, the pins have insufficient mechanical strength due to the comparatively brittle nature of such materials.

SUMMARY OF THE INVENTION

The present invention in one aspect relates to a device for processing wafer-shaped articles, comprising a rotary chuck having a series of pins adapted to hold a wafer shaped article on the rotary chuck. Each of the pins comprises a cylindrical body and a projecting gripping portion formed integrally therewith and being of a ceramic material. The gripping portion comprises cylindrical surfaces having a common generatrix with surfaces of the cylindrical body.

In preferred embodiments of the device according to the present invention, the device further comprises a closed process chamber containing the rotary chuck.

In preferred embodiments of the device according to the present invention, each of the series of pins comprises a base portion rigidly mounted in a separate gear element, and the device further comprises a ring gear in meshing engagement with each gear element so as to drive the series of pins in unison over a defined angular range.

In preferred embodiments of the device according to the present invention, each gear element is formed of metal or a thermally resistant and chemically inert plastic material.

In preferred embodiments of the device according to the present invention, the ceramic material is selected from the group consisting of $Al_2O_3$, $Y_2O_3$, SiC, $Si_3N_4$, AlN, cordierite ($2MgO.2Al_2O_3.5SiO_2$) zirconia ($ZrO_2$), quartz ($SiO_2$) and combinations thereof.

In preferred embodiments of the device according to the present invention, each of the series of pins is mounted for rotation about a central axis of the cylindrical body.

In preferred embodiments of the device according to the present invention, the cylindrical surfaces of the gripping portion extend over 45° to 270° of the circumference of the cylindrical body, preferably over 90° to 235° of the circumference of the cylindrical body, more preferably over 135° to 180° of the circumference of the cylindrical body, and most preferably over 140° to 175° of the circumference of the cylindrical body.

In preferred embodiments of the device according to the present invention, the cylindrical surfaces of the gripping portion are interrupted by a groove extending radially inwardly from the cylindrical surfaces, the groove being dimensioned to receive and engage a peripheral edge of a wafer-shaped article having a thickness from 500 to 1,000 microns.

In preferred embodiments of the device according to the present invention, each projecting gripping portion does not extend radially outwardly of its corresponding cylindrical body and each projecting gripping portion in plan view overlies not more than two thirds of its corresponding cylindrical body, thereby to facilitate release of a wafer shaped article from each gripping portion as the cylindrical surfaces of the gripping portion are moved radially outwardly of an axis of rotation of the chuck by rotation of the cylindrical body about its axis.

In preferred embodiments of the device according to the present invention, the rotary chuck is adapted to be driven without physical contact through a magnetic bearing.

In preferred embodiments of the device according to the present invention, the cylindrical surfaces of the gripping portion adjoin a radially inwardly extending contact surface adapted to engage a peripheral edge of a wafer-shaped article only on a surface facing away from the rotary chuck.

In preferred embodiments of the device according to the present invention, the gripping portion has no plane of symmetry parallel to an axis of the cylindrical body.

The present invention in another aspect relates to a gripping pin for use in a device for processing wafer-shaped articles, the gripping pin comprising a cylindrical body and a projecting gripping portion formed integrally therewith and being of a ceramic material, the gripping portion comprising cylindrical surfaces having a common generatrix with surfaces of the cylindrical body.

In preferred embodiments of the gripping pin according to the present invention, it further comprises a base portion rigidly mounted in a separate gear element formed of metal or a thermally resistant and chemically inert plastic material.

In preferred embodiments of the gripping pin according to the present invention, the projecting gripping portion does not extend radially outwardly of the cylindrical body and the projecting gripping portion in plan view overlies not more than two thirds of the cylindrical body.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
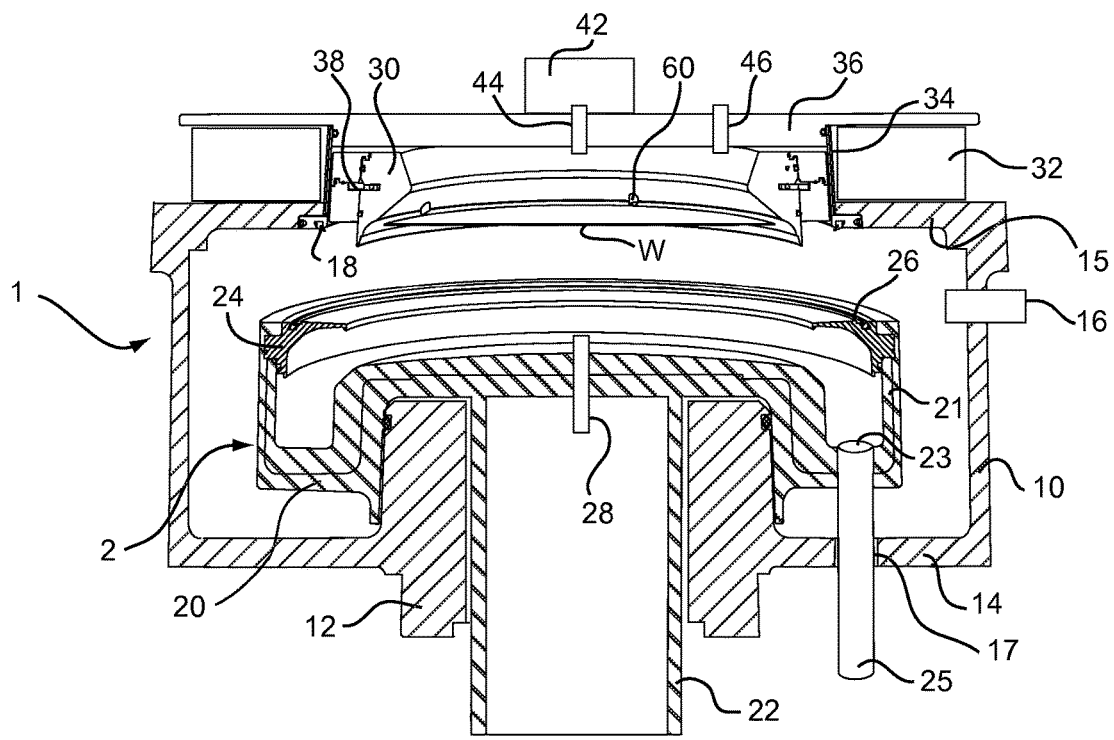
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during used of the apparatus. The rotary chuck 30 incorporates a rotary drive comprising ring gear 38, which engages and drives a plurality of eccentrically movable gripping members 60 for selectively contacting and releasing the peripheral edge of a wafer W, as will be described in detail below.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 32 serve as a motor by which the ring rotor 30 (and thereby a supported wafer W) may be rotated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a manifold 42 mounted on its exterior, which supplies a medium inlet 44 that traverses the lid 36 and opens into the chamber above the wafer W. It will be noted that the wafer W in this embodiment hangs downwardly from the rotary chuck 30, supported by the gripping members 60, such that fluids supplied through inlet 44 would impinge upon the upwardly facing surface of the wafer W.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, whereas a separate exhaust opening 46 traverses the lid 36 near the inner surface of rotary chuck 30. Each exhaust opening is connected to suitable exhaust conduits (not shown), which are preferably independently controlled via respective valves and venting devices.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

Figure 2:
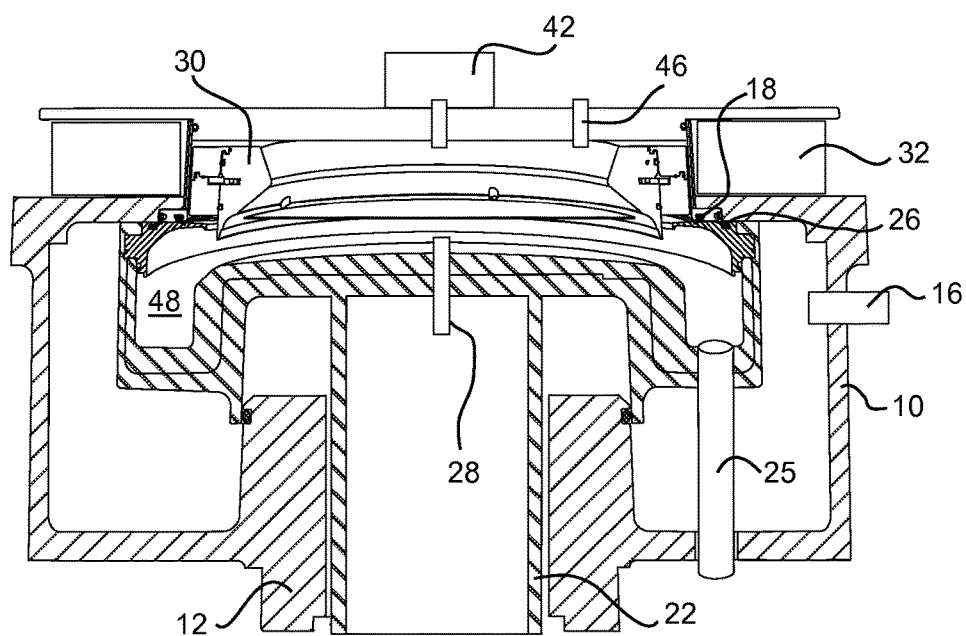
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of the exhaust port 46 opening into the chamber 48, independently from the exhaust port 16 that serves the chamber 1 in general, and the remainder of the chamber 1 in the FIG. 2 configuration.

During processing of a wafer, processing fluids may be directed through medium inlets 44 and/or 28 to a rotating wafer W in order to perform various processes, such as etching, cleaning, rinsing, and any other desired surface treatment of the wafer undergoing processing.

Figure 3:
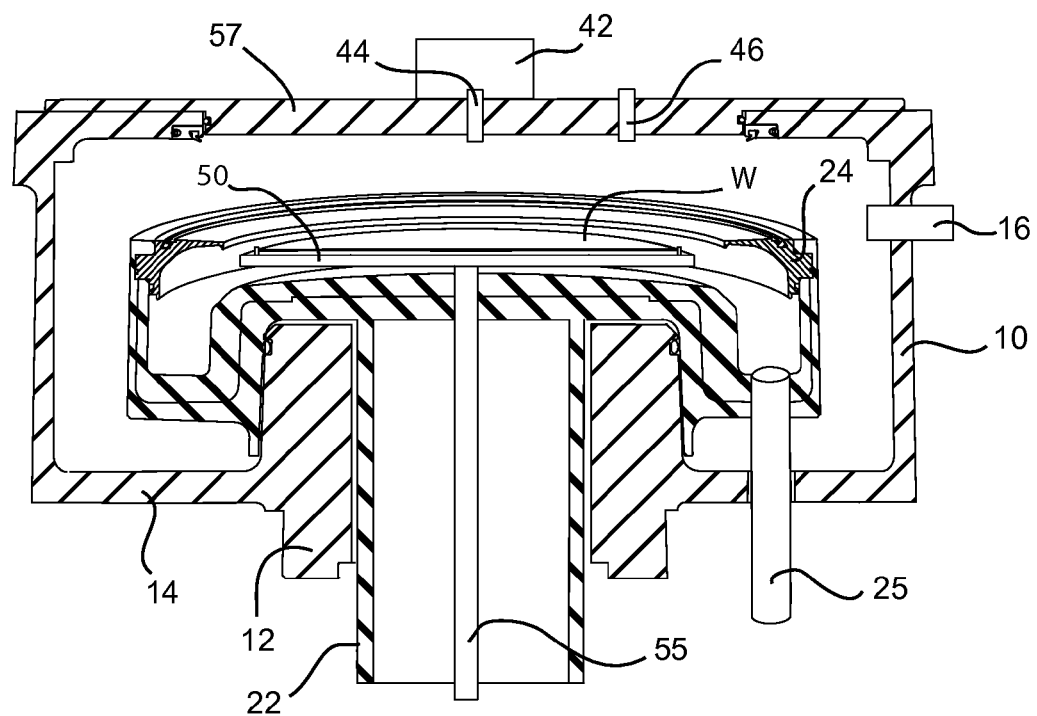
FIG. 3 is an explanatory cross-sectional side view of a process chamber according to a second embodiment of the invention, with the interior cover shown in its first position.
Figure 4:
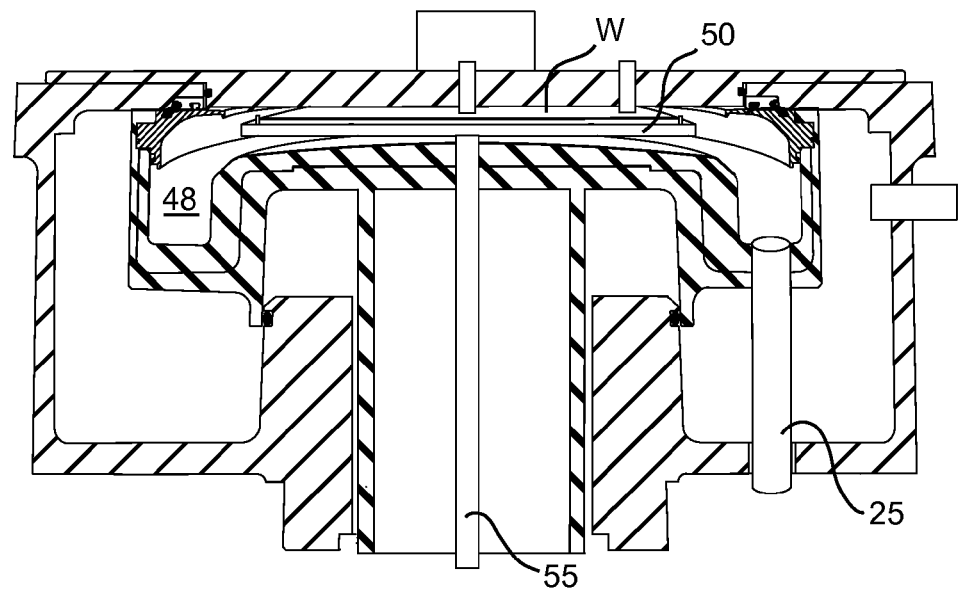
FIG. 4 is an explanatory cross-sectional side view of a process chamber according to the second embodiment of the invention, with the interior cover shown in its second position.

FIGS. 3 and 4 show a third embodiment of the present invention, in which the chamber design of the first embodiment is adapted for use with a spin chuck in which a wafer W is mounted on an upper side of a chuck that is rotated through the action of a motor on a central shaft.

In particular, wafer W is loaded onto spin chuck 50 when interior cover 2 is in the loading/unloading position depicted in FIG. 3, and wafer W is secured in the predetermined orientation relative to chuck 50 by gripping members 60. Gripping members 60 are moved from a release position to a gripping position by a common ring gear as described above in connection with the embodiment of FIGS. 1 and 2, and also as described in U.S. Pat. No. 5,513,668. Interior cover 2 is then moved to its second position, as described above in connection with the first embodiment, to define the inner chamber 48.

As the spin chuck 50 of this embodiment is not vertically moveable relative to the interior cover 2, the movement of the interior cover 2 serves simultaneously to position wafer W at its final processing position within the chamber 48. Spin chuck 50 is then rotated by a motor (not shown) acting upon shaft 55.

Figure 5:
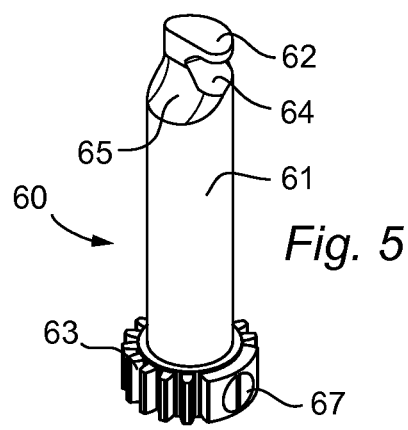
FIG. 5 is perspective view of a gripping pin according to an embodiment of the invention.
Figure 13:
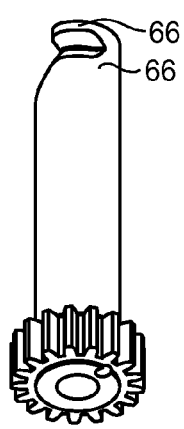
FIG. 13 is a perspective view of the gripping pin of FIG. 5 viewed from a different angle.
Figure 15:
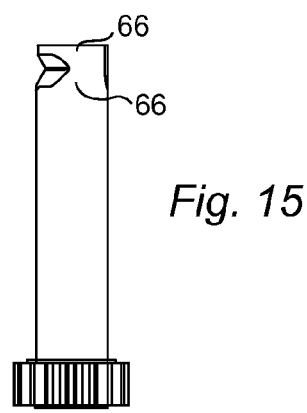
FIG. 15 is a side view of the gripping pin of FIG. 5 from the opposite vantage as that of FIG. 9.

Referring now to FIG. 5, a first embodiment of the improved gripping pins according to the present invention is there depicted. Gripping pin 60 of FIG. 5 comprises a cylindrical body 61 and a projecting gripping portion 62 formed integrally therewith from a ceramic material. The gripping portion comprises cylindrical surfaces 66 (see FIGS. 13 and 15) that have a common generatrix with surfaces of the cylindrical body 61.

The gripping portion 62 is formed by grinding a cylindrical blank of ceramic material, such as $Al_2O_3$, $Y_2O_3$, SiC, $Si_2N_4$, AlN, cordierite (2MgO.2 $Al_2O_2$.5$SiO_2$) zirconia ($ZrO_2$), quartz ($SiO_2$) and combinations thereof. In particular, material is ground away from one end of the cylindrical blank to form the sloped region 65 depicted in FIG. 5, the gripping portion 62, and the groove 64 formed within the gripping portion 62.

Thus, a significant surface area of the gripping portion 62 is original to the cylindrical blank, with these original surfaces 66 thus having a common generatrix as the cylindrical surfaces of the body 61. As a result, gripping portion 62 has far greater mechanical strength than in none of its surfaces shared a common generatrix with the underlying body portion 61, as is the case for conventional gripping pins.

At the base of the gripping pin 60 there is a gear element 63, which is preferably a separately-formed element made from a metal or a thermally-resistant and chemically inert plastic material such as polyetheretherketone (PEEK). Gear element 63 is secured to pin 60 via a screw 67. Forming the gear element 63 separately from metal or plastic is advantageous in that the gear teeth can be formed more readily in such materials, as compared to a ceramic material in which it is very difficult to form gear teeth.

Screw 67 is preferably threaded into a bore in the gear element 63, but there need not be threading provided in the corresponding bore 69 in the ceramic pin 60, as the screw 67 serves mainly to prevent axial movement of the pin 60 relative to the gear element 63. Indeed, screw 67 may also be replaced by a smooth pin where the chuck structure surrounding the gear element would prevent outward displacement of such a smooth pin.

Figure 6:
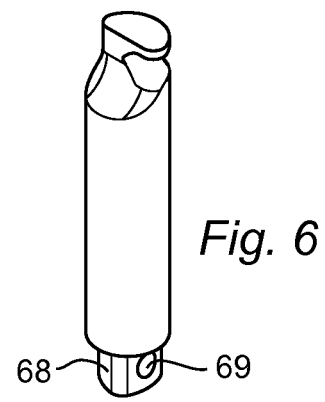
FIG. 6 is perspective view of the gripping pin of FIG. 5, with its separate gear element removed.
Figure 7:
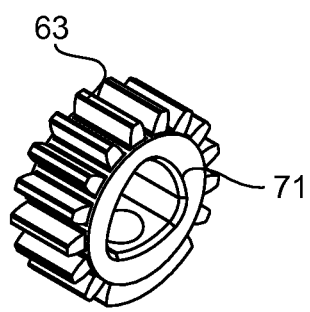
FIG. 7 is perspective view of the separate gear element of the gripping pin of FIG. 5.

In FIG. 6, gear element 63 has been removed to reveal a base portion 68, which has a rounded triangular shape, and fits within a mating rounded triangular opening 71 formed in the gear element 63. Relative rotation between the gear element 63 and pin 60 is thus prevented by the interfitting shapes of these elements as well as by the screw 67 received within bore 69.

The position of screw 67 in FIG. 5 corresponds to the closed or gripping orientation of pin 60. That is, when screw 67 faces radially inwardly toward the axis of rotation of the chuck 30 or 50, the peripheral edge of a wafer-shaped article received on the chuck will be securely held within the groove 64 of gripping portion 62. Several gear teeth are omitted to accommodate screw 67, and thus the ring gear 38 that meshes with gear element 63 will surround the circular series of pins 60, with an inner ring of gear teeth in simultaneous meshing engagement with the gear elements 63 of each of the circular series of pins 60.

Figure 11:
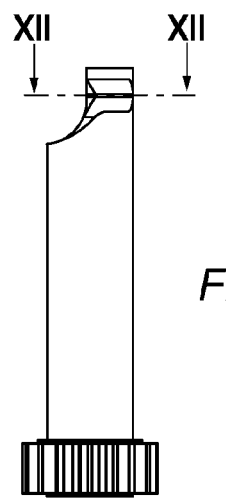
FIG. 11 is a side view of the gripping pin of FIG. 5 from the same vantage as that of FIG. 10.

This is also the position illustrated in FIG. 11, in which the screw 67 is omitted for ease of illustration.

Alternatively, the circular series of pins 60 could surround the ring gear, in which case the ring gear would be designed with an outer ring of gear teeth in simultaneous meshing engagement with the gear elements 63 of each of the circular series of pins 60. In that case, the screw would be positioned on the side of the gear element 63 opposite that shown in FIG. 5.

Figure 8:
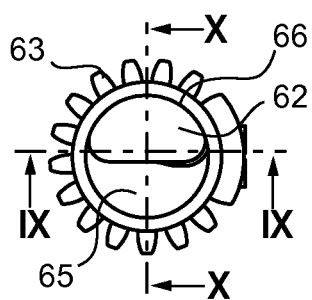
FIG. 8 is a plan view of the gripping pin of FIG. 5.

The plan view of FIG. 8 reveals that the original cylindrical surfaces 66 remaining in the gripping portion 62 extend over nearly half the circumference of pin 60, whereas the area of the gripping portion 62 in a radial plane is approximately half that of the body portion 61. The resulting void, which corresponds to the volume of material removed from this end of the cylindrical blank other than in groove 64, permits releasing the wafer edge when the pin 60 is rotated about its axis such that the side of the pin shown in FIG. 14 faces the chuck rotation axis.

Figure 9:
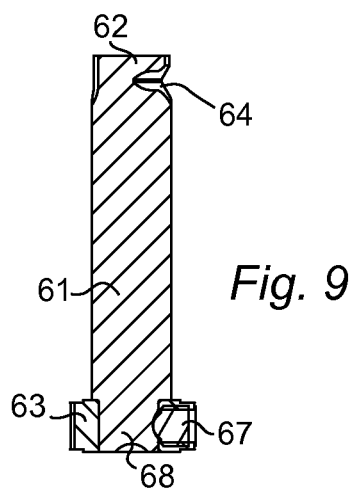
FIG. 9 is a sectional view along the line IX-IX of FIG. 8.
Figure 10:
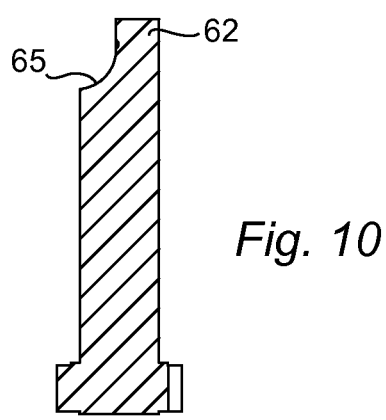
FIG. 10 is a sectional view along the line X-X of FIG. 8.
Figure 12:
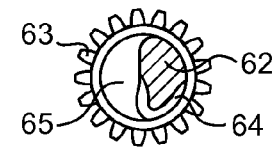
FIG. 12 is a sectional view along the line XII-XII of FIG. 11.

Further structural details of the pin 60 of the present embodiment are revealed by the axial sections of FIGS. 9 and 10, and the radial section of FIG. 12. For example, the gripping portion 62 of this embodiment has no axial plane of symmetry. Consequently, it must be opened only in one direction of rotation and closed only in the other direction, hence a "one-way" pin. However, it is also within the scope of the invention to fashion the gripping pin such that it can be opened or closed in either direction of rotation, thus a "two-way" pin.

Operation of the pin 60 depicted in FIGS. 5-15 is generally as described in connection with U.S. Pat. Nos. 4,903, 717 and 5,513,668 referenced above. In the present embodiment, a wafer-shaped article W is positioned at the desired working elevation, with pins 60 in the open position, i.e., the position in which the side illustrated in FIG. 14 faces the center of the chuck rotation axis.

Typically the number of pins 60 is six, although depending upon the application that number could be as few as three and as many as twelve or more. The pins 60 are preferably regularly spaced outside the periphery of the article to be processed, thus in the case of six pins 60 they would be spaced apart by 60°.

When the article to be processed is a semiconductor wafer, such wafers are of standard diameters and thicknesses. Thus, for a 300 mm diameter wafer, the pins 60 are positioned and dimensioned such that body portion 61 overlaps the wafer diameter (and so too the surfaces 66 when the pins are closed), whereas the groove 64 is dimensioned such that the base (radially innermost part) of the groove will always lie just outside the wafer diameter. The same of course applies for wafers of other diameters, such as 200 mm and 450 mm.

The groove 64 of this embodiment has a width (or axial extent) designed to securely hold a wafer-shaped article when pins 60 are closed. Such a width would be just greater than the wafer thickness, which will typically be in a range from 500 micron to 1000 micron.

Figure 14:
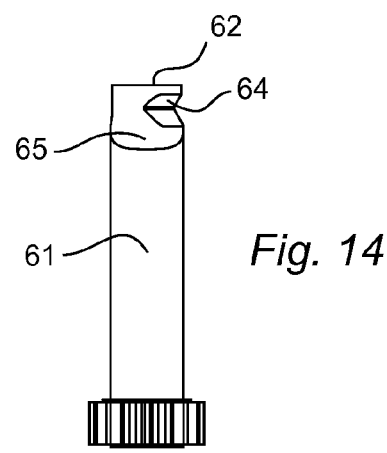
FIG. 14 is a side view of the gripping pin of FIG. 5 from the same vantage as that of FIG. 9.

Once a wafer W is correctly positioned on the chuck 30 or 50, the pins 60 are conjointly turned by ring gear 38 a quarter turn, from the position shown in FIG. 14 to that shown in FIG. 11, so as to clamp the wafer W securely in place.

Figure 16:
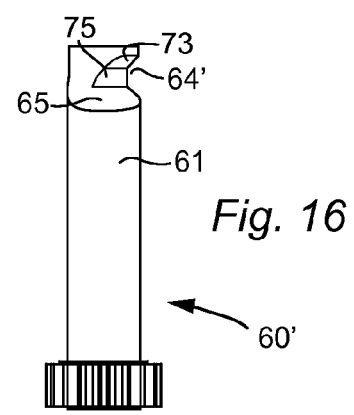
FIG. 16 is a side view similar to that of FIG. 14, depicting an alternative embodiment of a gripping pin.

FIG. 16 depicts an alternative embodiment of a gripping pin 60', which differs from the gripping pin 60 of the preceding embodiments as to the shape of the groove 64'. In particular, the groove 64' of this embodiment is made considerably wider, such that it effectively has no proximal side surface. That is, during the normal processing conditions of a wafer W on a chuck 30 or 50, the range of axial travel of the wafer relative to the chuck is limited at one extreme by the distal side surface 73 of groove 64', but at the opposite extreme its axial range of motion the wafer W does not make contact with the pin 60'.

Instead, wafer W is forced against surface 73 of groove 64' solely by the force of a gas flow applied against the proximal wafer surface, and may be retracted from contact with surface 73 by a suitable decrease in the gas flow. The bottom (or radially innermost) surface 75 of groove 64' thus corresponds to the range of axial travel permitted to a wafer W in this embodiment.

What is claimed is:

1. A device for processing a wafer, the device comprising:
a rotary chuck; and
a series of pins disposed on the rotary chuck and adapted to hold the wafer on the rotary chuck,
wherein
each of the pins comprises
a body that is cylindrically-shaped, and
a gripping portion formed integrally with the body and formed of a ceramic material,
the gripping portion comprises a groove, a first section and a second section,
the groove is configured to receive an edge of the wafer,
the first section is at a distal most end of the pin and includes a first portion of the groove,
the second section is at a distal most end of the body and includes a second portion of the groove,
the gripping portion comprises a first surface having a common generatrix with a second surface of the body,
the second surface is cylindrically-shaped,
the groove comprises a first sloped region extending from a radially innermost portion of the groove to the second surface of the body, and
each of the pins further includes a second sloped region distinct from the first sloped region and extending from the second surface of the body to the first section of the gripping portion and the first sloped region.

2. The device according to claim 1, further comprising:
a plurality of gears,
wherein each of the pins comprises a base portion rigidly mounted in one of the plurality of gears via a respective fastener; and
a ring gear in meshing engagement with each of the plurality of gears to drive the pins in unison, wherein the ring gear rotates the plurality of gears and as a result the pins between corresponding angular positions.

3. The device according to claim 2, wherein each of said the plurality of gears is formed of metal or a thermally resistant and chemically inert plastic material.

4. The device according to claim 1, wherein the ceramic material includes at least one of $Al_2O_3$, $Y_2O_3$, SiC, $Si_3N_4$, AlN, cordierite ($2MgO·2Al_2O_3·5SiO_2$) zirconia ($ZrO_2$), or quartz ($SiO_2$).

5. The device according to claim 1, wherein the pins are configured to rotate about respective central axes of the bodies of the pins.

6. The device according to claim 1, wherein the first surfaces of the gripping portions extend over 45° to 270° of respective circumferences of the bodies of the pins.

7. The device according to claim 1, wherein:
the grooves extend radially inward from a respective one of the second surfaces of the bodies; and
each of the grooves are dimensioned to receive and engage the edge of the wafer, where the edge of the wafer has a thickness of 500 to 1,000 microns.

8. The device according to claim 1, wherein:
the gripping portions, in an end view of the pins, do not extend over more than two thirds of respective distal ends of the bodies of the pins; and
the rotary chuck is configured to facilitate release of the wafer from the gripping portions as the first surfaces of the gripping portions are moved radially outward of an axis of rotation of the rotary chuck by rotation of the bodies of the pins about respective axes of the pins.

9. The device according to claim 1, wherein the rotary chuck is adapted to be driven via a magnetic bearing and without mechanical actuation and contact with the rotary chuck.

10. The device according to claim 1, wherein:
the first surfaces of the gripping portions adjoin respective radially inwardly extending surfaces of the grooves;
the radially inward extending surfaces of the grooves adjoin radially innermost surfaces of the grooves;
the edge of the wafer comprises a radially outward facing surface; and
the innermost surfaces of the grooves are adapted to engage only the radially outward facing surface of the wafer.

11. The device according to claim 1, wherein each of the gripping portions has no plane of symmetry that is parallel to a central axis of a corresponding one of the bodies of the pins.

12. The device according to claim 1, wherein widths of the grooves decrease circumferentially from first ends of the grooves to second ends of the grooves.

13. The device according to claim 12, wherein:
each of the pins are configured to be rotated between a first position and a second position;
while in the first position, the grooves receive or release the wafer at the first end of the groove;
while in the second position, the grooves grip the wafer via the second end of the groove; and
the pins are rotated between the first positions and the second positions to release and grip the wafer.

14. A system comprising:
the device of claim 1; and
a closed process chamber containing the rotary chuck.

15. A gripping pin for use in a device that processes a wafer, the gripping pin comprising:
a body, wherein the body is cylindrically-shaped;
a gripping portion formed integrally with the body, wherein
the gripping portion is formed of a ceramic material,
the gripping portion comprises a first cylindrically-shaped surface having a common generatrix with a second cylindrically-shaped surface of the body,
the gripping portion comprises a groove,
a width of the groove decreases circumferentially from a first end of the groove to a second end of the groove,
the pin is configured to be rotated between a first position and a second position,
while in the first position, the groove receives or releases the wafer at the first end of the groove,
while in the second position, the groove grips the wafer via the second end of the groove, and
the pin is rotated between the first position and the second position to release and grip the wafer; and
a first sloped region extending between the body and the gripping portion.

16. The gripping pin according to claim 15, further comprising a gear and a fastener, wherein:
the gear is attached to a base portion of the gripping pin via the fastener; and
the gear is formed of metal or a thermally resistant and chemically inert plastic material.

17. The gripping pin according to claim 15, wherein the gripping portion, in an end view of the gripping pin, does not extend radially outward of the body and does not extend over more than two thirds of a distal end of the body.

18. The gripping pin of claim 15, wherein:
the groove comprises a second sloped region;
the second sloped region extends from the body to a radially innermost surface of the groove; and
the first sloped region is distinct from the second sloped region and extends from the body to the second sloped region.

* * * * *